United States Patent
Kim et al.

(10) Patent No.: US 9,136,311 B2
(45) Date of Patent: Sep. 15, 2015

(54) FLEXIBLE SUBSTRATE, FLEXIBLE DISPLAY DEVICE, AND METHOD FOR MANUFACTURING FLEXIBLE DISPLAY DEVICE

(71) Applicant: Samsung Display Co., Ltd., Yongin, Gyeonggi-do (KR)

(72) Inventors: Jong-Yun Kim, Yongin (KR); Jin-Taek Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/975,244

(22) Filed: Aug. 23, 2013

(65) Prior Publication Data

US 2014/0299848 A1 Oct. 9, 2014

(30) Foreign Application Priority Data

Apr. 3, 2013 (KR) ........................ 10-2013-0036352

(51) Int. Cl.
*H01L 51/52* (2006.01)
*H01L 27/32* (2006.01)
*H01L 51/00* (2006.01)

(52) U.S. Cl.
CPC ........ *H01L 27/3244* (2013.01); *H01L 51/0097* (2013.01); *H01L 2924/0002* (2013.01)

(58) Field of Classification Search
None
See application file for complete search history.

(56) References Cited

U.S. PATENT DOCUMENTS

2012/0168765 A1* 7/2012 Kim et al. ........................ 257/72
2013/0250200 A1* 9/2013 Ohue .............................. 349/42

FOREIGN PATENT DOCUMENTS

| JP | 2009-164650 A | 7/2009 |
| KR | 10-0804003 B1 | 2/2008 |
| KR | 10-0831562 B1 | 5/2008 |
| KR | 10-0922951 B1 | 10/2009 |

OTHER PUBLICATIONS

Transparent conducting, anti-static and anti-static-anti-glare coatings on plastic substrates, N. Al-Dahoudi et. al., Thin Solid Films 392 (2001) 299-304.*
Korean Publication No. 10-2007-0096278 A which corresponds to KR 10-0831562 B1, 2 pages.
Korean Publication No. 10-2009-0047885 A which corresponds to KR 10-0922951 B1, 2 pages.

* cited by examiner

*Primary Examiner* — Charles Garber
*Assistant Examiner* — Alia Sabur
(74) *Attorney, Agent, or Firm* — Christie, Parker & Hale, LLP

(57) ABSTRACT

A flexible substrate includes: a flexible substrate main body including an organic material; a plurality of separation patterns distributed across one side of the flexible substrate main body; and a separation groove on the one side of the flexible substrate main body adjacent to at least one of the separation patterns, and the separation groove being recessed from a surface of the one side of the flexible substrate main body.

6 Claims, 9 Drawing Sheets

FLEXIBLE SUBSTRATE, FLEXIBLE DISPLAY DEVICE, AND METHOD FOR MANUFACTURING FLEXIBLE DISPLAY DEVICE

CROSS-REFERENCE TO RELATED APPLICATION

This application claims priority to and the benefit of Korean Patent Application No. 10-2013-0036352 filed in the Korean Intellectual Property Office on Apr. 3, 2013, the entire content of which is incorporated herein by reference.

BACKGROUND

1. Field

Aspects of embodiments of the present invention relate to a flexible substrate, a flexible display device, and a method for manufacturing a flexible display device. More particularly, embodiments of the present invention generally relate to a flexible substrate including an organic material, a flexible display device, and a method for manufacturing a flexible display device. 2. Description of the Related Art A display device is a device that displays an image. Recently, organic light emitting diode displays have been drawing attention.

An organic light emitting diode display has a self-luminous characteristic, and because, unlike a liquid crystal display, the organic light emitting diode display does not need a separate light source it can have a relatively small thickness and low weight. In addition, the organic light emitting diode display exhibits high-quality and desirable characteristics such as low power consumption, high luminance, high response speed, etc.

In general, an organic light emitting diode (OLED) display includes a substrate, an organic light emitting diode on the substrate, and an encapsulator sealing the organic light emitting diode with the substrate.

Recently, a flexible display device including a flexible substrate made of an organic material such as a polyimide has been developed.

The flexible display device is manufactured by forming a flexible substrate on a support substrate such as glass, forming an organic light emitting diode and an encapsulator on the flexible substrate, and peeling the flexible substrate from the support substrate.

However, a conventional flexible display device can damage the organic light emitting diode formed on the flexible substrate due to static electricity being developed and discharged when the flexible substrate is peeled from the support substrate.

The above information disclosed in this Background section is only for enhancement of understanding of the background of the described technology and therefore it may contain information that does not form the prior art that is already known in this country to a person of ordinary skill in the art.

SUMMARY

Aspects of embodiments of the present invention are directed to a method for manufacturing a flexible substrate for controlling generation of static electricity, a flexible display device, and a method of manufacturing a flexible display device.

An exemplary embodiment provides a flexible substrate including: a flexible substrate main body including an organic material; a plurality of separation patterns distributed across one side of the flexible substrate main body; and a separation groove on the one side of the flexible substrate main body adjacent to at least one of the separation patterns, the separation groove being recessed from a surface of the one side of the flexible substrate main body.

The separation pattern may include poly indium tin oxide (poly-ITO).

The separation pattern may be embedded in the flexible substrate main body.

The organic material may include a polyimide.

Another embodiment provides a flexible display device including a flexible substrate according to the above-described embodiment, and a display provided on the flexible substrate and configured to display an image.

The display may include an organic light emitting diode.

Yet another embodiment provides a method for manufacturing a flexible display device, the method including: forming a separation layer on a support substrate; forming a photosensitive pattern on the separation layer; etching the separation layer using the photosensitive pattern as a mask to form a support pattern corresponding to the photosensitive pattern and a plurality of separation patterns, at least one of the separation patterns being adjacent the support pattern and being distributed across the support substrate; removing the photosensitive pattern; applying an organic material to the support substrate to form a flexible substrate main body covering the support pattern and the separation pattern; forming a display on the flexible substrate main body, the display being configured to display an image; and separating the flexible substrate main body from the support substrate.

The forming the separation layer may include depositing amorphous indium tin oxide (a-ITO) on the support substrate.

The forming the separation layer may include forming the separation layer to be 300 Å to 1100 Å thick, and forming poly indium tin oxide on the separation layer.

The etching the separation layer may include using a dry etching method using an etchant adapted to remove the amorphous indium tin oxide.

The separating the flexible substrate main body from the support substrate may include peeling the flexible substrate main body from the support substrate.

The separating the flexible substrate main body from the support substrate may include separating the separation pattern embedded in the flexible substrate main body from the support substrate, separating the flexible substrate main body from the support pattern, and forming a separation groove depressed from one surface of the flexible substrate main body corresponding to the support pattern on one side of the flexible substrate main body.

According to one of the embodiments, the flexible substrate for controlling generation of static electricity, the flexible display device, and the method for manufacturing a flexible display device are provided.

DETAILED DESCRIPTION

Figure 1:
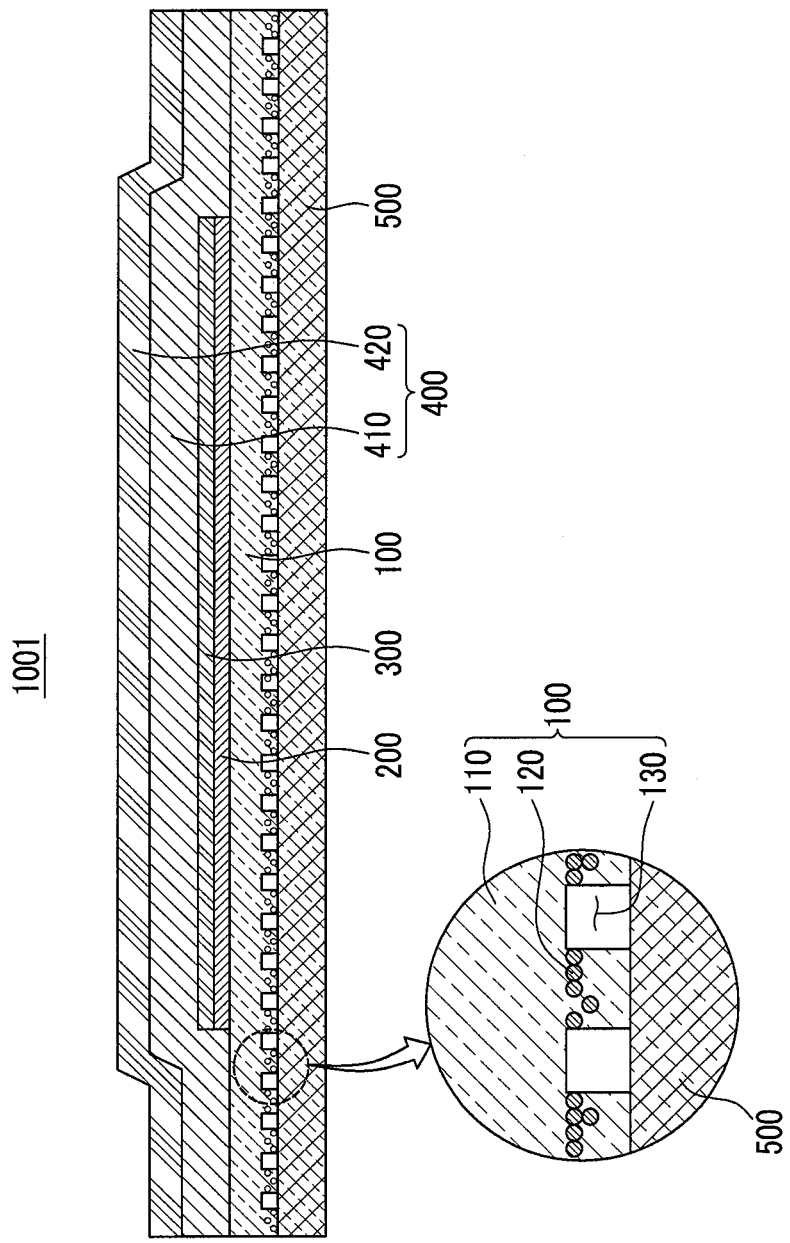
FIG. 1 shows a cross-sectional view of a flexible display device according to a first exemplary embodiment of the present invention.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Accordingly, the drawings and description are to be regarded as illustrative in nature and not restrictive, and like reference numerals designate like elements throughout the specification.

Further, in the drawings, the sizes and the thicknesses of the components are provided for the convenience of description, embodiments of the present invention are not limited those shown in the drawings.

In the drawings, the thickness of layers, films, panels, regions, etc., are exaggerated for clarity. The thicknesses of some layers and areas are exaggerated for convenience of explanation. When it is described that one element such as a layer, a film, an area, a plate, etc. is formed on another element, it means that one element exists directly on another element or that one element exists on another element with a further element therebetween.

In addition, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference.

A flexible display device according to a first exemplary embodiment will now be described with reference to FIGS. 1, 2, 3, and 4. Hereinafter, an organic light emitting diode for a display for displaying images will be described. The display for displaying image includes an organic light emitting diode in the first exemplary embodiment, and the display may be a liquid crystal, plasma, or electronic ink display in another exemplary embodiment.

Hereinafter, a crystallization separating pattern signifies a separation pattern.

FIG. 1 shows a cross-sectional view of a flexible display device according to a first exemplary embodiment of the present invention.

As shown in FIG. 1, the flexible display device 1001 includes a flexible substrate 100, wiring 200, an organic light emitting diode 300, an encapsulator 400, and a protection film 500.

The flexible substrate 100 is transmissive of light. The wiring 200 and the organic light emitting diode 300 are provided on the flexible substrate 100, and the flexible substrate 100 faces the encapsulator 400 with the wiring 200 and the organic light emitting diode 300 therebetween. The flexible substrate 100 seals the organic light emitting diode 300 with the encapsulator 400. The flexible substrate 100 includes a flexible substrate main body 110, a crystallization separating pattern 120, and a separation groove 130.

The flexible substrate main body 110 is made of an organic material including at least one of polyethylene terephthalate, a polyimide, a polycarbonate, an epoxy, polyethylene, and a polyacrylate. The flexible substrate main body 110 may also include a polyimide in the organic material. The flexible substrate main body 110 is flexible and transmissive of light.

The crystallization separating pattern 120 is distributed and provided at (e.g., distributed across or over) a bottom of the flexible substrate main body 110 that may be one side of the flexible substrate main body 110. The crystallization separating pattern 120 includes poly indium tin oxide (poly-ITO). The crystallization separating pattern 120 is provided in the flexible substrate main body 110. There may be a plurality of crystallization separating patterns 120 having a granular form (e.g., the crystallization separating patterns may include a plurality of granules), and the plurality of crystallization separating patterns 120 having the granular form are respectively connected, separated or spaced apart to be distributed in the flexible substrate main body 110. The crystallization separating pattern 120 may be separated (or spaced apart) from a bottom surface of the flexible substrate main body 110. At least one of the crystallization separating patterns 120 neighbors the separation groove 130. (E.g., the granules of the crystallization separating patterns may be spaced apart from one another by the separation grooves 130 and clustered together in the regions of the flexible substrate main body 110 between the separation grooves 130.)

The separation groove 130 is adjacent to the crystallization separating pattern 120 and is provided at the bottom of the flexible substrate main body 110. The separation groove 130 is recessed (or is formed as a recess) from the bottom surface of the flexible substrate main body 110. There are a plurality of separation grooves 130 that are disposed along the bottom surface of the flexible substrate main body 110.

The wiring 200 includes a first thin film transistor 10 and a second thin film transistor 20 (shown, for example, in FIG. 2), and transmits a signal to the organic light emitting diode 300 to drive the organic light emitting diode 300. The organic light emitting diode 300 emits light in accordance with the signal provided by the wiring 200.

The organic light emitting diode 300 is provided on the wiring 200.

The organic light emitting diode 300 is provided on the flexible substrate 100 and receives the signal from the wiring 200 to display the image.

Figure 2:
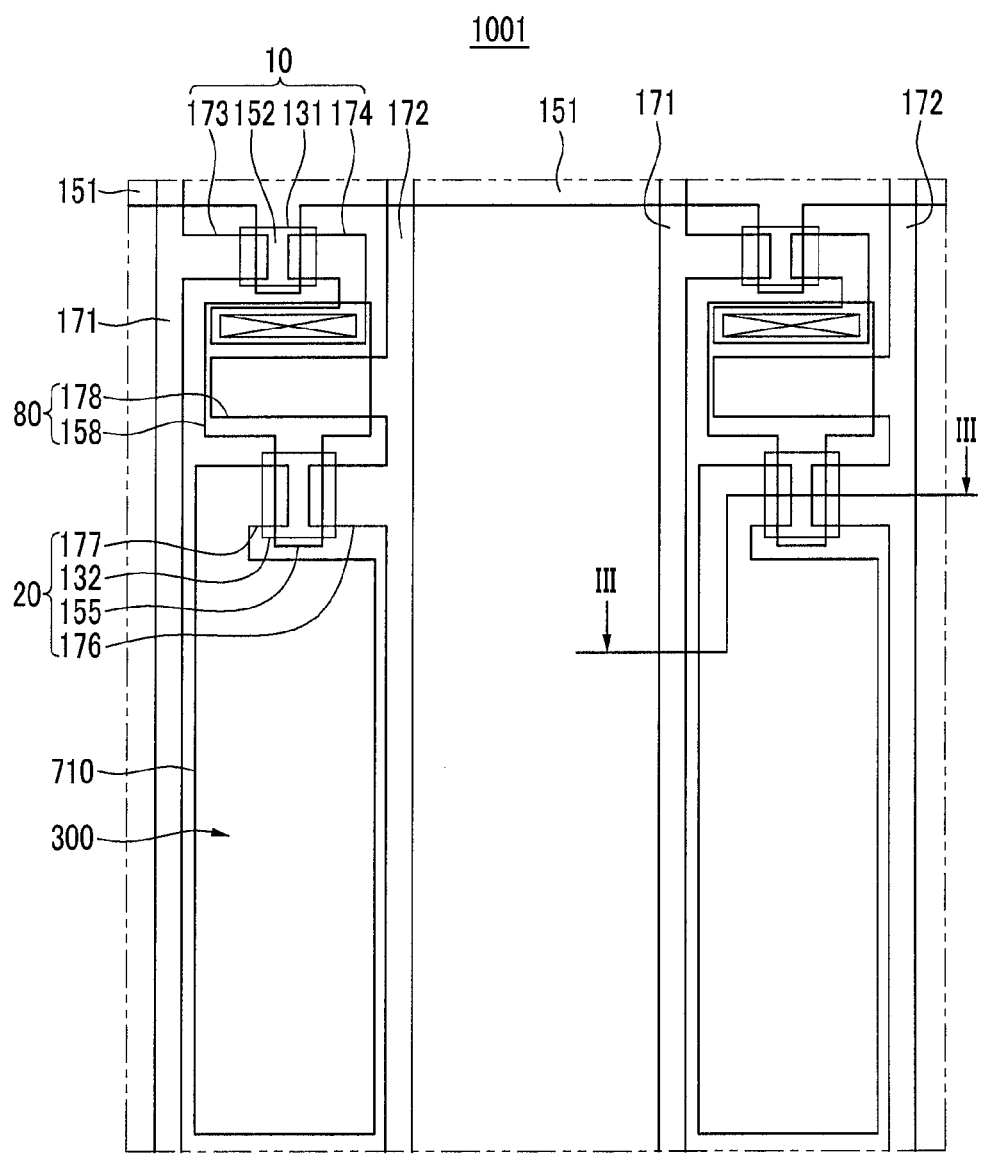
FIG. 2 shows a layout view of a configuration of a pixel of a flexible display device according to the first exemplary embodiment of the present invention.
Figure 3:
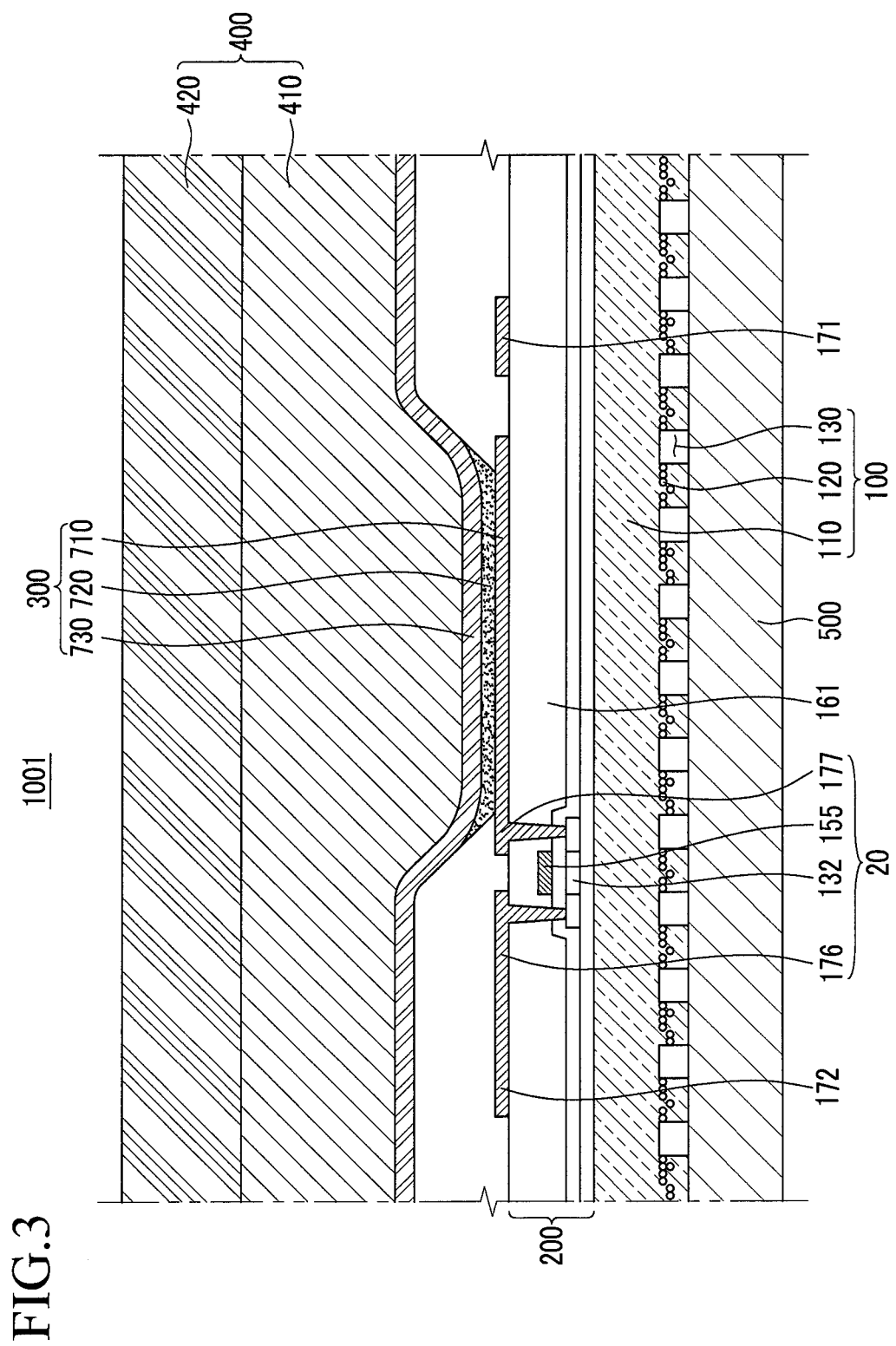
FIG. 3 shows a cross-sectional view with respect to a line of FIG. 2.

Referring to FIG. 2 and FIG. 3, an internal configuration of a flexible display device 1001 according to a first exemplary embodiment will now be described in more detail.

FIG. 2 shows a layout view of a configuration of a pixel of a flexible display device according to a first exemplary embodiment. FIG. 3 shows a cross-sectional view with respect to a line of FIG. 2.

Detailed configurations of the wiring 200 and the organic light emitting diode 300 are shown in FIG. 2 and FIG. 3, but embodiments of the present invention are not restricted to the configurations shown in FIG. 2 and FIG. 3. The wiring 200 and the organic light emitting diode 300 can be formed with various configurations by a person skilled in the art. For example, a 2Tr-1 Cap active matrix (AM) type of flexible display device having two thin film transistors (TFTs) and a capacitor for each pixel is shown for the flexible display device in the drawing, but embodiments of the present invention are not limited thereto. The flexible display device is not limited in the number of thin film transistors, capacitors, and wires. The pixel represents a unit for displaying the image, and the display device uses a plurality of pixels to display the image.

As shown in FIG. 2 and FIG. 3, the flexible display device 1001 includes a switching thin film transistor 10, a driving thin film transistor 20, a capacitor 80, and an organic light emitting diode 300 for each pixel. Here, the switching thin film transistor 10, the driving thin film transistor 20, and the capacitor 80 form the wiring 200. The wiring 200 further includes a gate line (or scan line) 151 disposed in a first direction of the flexible substrate 100, a data line 171 crossing the gate line 151 in an insulated manner, and a common power supply line 172. Here, one pixel is defined with a boundary of the gate line 151, the data line 171, and the common power supply line 172, but embodiments of the present invention are not limited thereto.

The organic light emitting diode 300 includes a first electrode 710, an organic emission layer 720 formed on the first electrode 710, and a second electrode 730 formed on the organic emission layer 720, where the first electrode 710, the organic emission layer 720, and the second electrode 730 are components of the organic light emitting diode 300. According to one embodiment, the first electrode 710 acts as an anode that is a hole injection electrode, and the second electrode 730 acts as a cathode that is an electron injection electrode. However, embodiments of the present invention are not restricted thereto, and the first electrode 710 can be a cathode and the second electrode 730 can be an anode according to the method used for driving a flexible display device. In one embodiment, holes and electrons are injected into the organic emission layer 720 from the first electrode 710 and the second electrode 730, respectively, and as excitons that are a combination of the holes and the electrons injected inside the organic emission layer 720 transit to a ground state from an exited state, the organic emission layer 720 emits light. Further, the first electrode 710 and the second electrode 730 can be respectively configured to be transmissive of light and reflective of light.

The capacitor 80 includes a pair of capacitor plates 158 and 178 with an interlayer insulating layer 161 disposed therebetween. Here, the interlayer insulating layer 161 is a dielectric material and the capacitance of the capacitor 80 is determined by charge stored in the capacitor 80 and a voltage between the capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switch for selecting a pixel to emit light. The switching gate electrode 152 is connected to a gate line 151. The switching source electrode 173 is connected to a data line 171. The switching drain electrode 174 is separated from the switching source electrode 173 and is connected to one capacitor plate 158.

The driving thin film transistor 20 applies a driving power voltage for emitting the organic emission layer 720 of the organic light emitting diode 300 in the selected pixel to the second electrode 730. The driving gate electrode 155 is connected to the capacitor plate 158 connected to the switching drain electrode 174. The driving source electrode 176 and the other capacitor plate 178 are connected to the common power supply line 172. The driving drain electrode 177 is provided on the same layer as the first electrode 710 and is connected to the first electrode 710.

In addition, the driving drain electrode can be provided on a different layer from the first electrode, and in this case, the first electrode is connected to the driving drain electrode through a contact hole.

In the above-noted configuration, the switching thin film transistor 10 is operated (or controlled) by the gate voltage applied to the gate line 151 and transmits the data voltage applied to the data line 171 to the driving thin film transistor 20. A voltage corresponding to a difference between a common voltage applied to the driving thin film transistor 20 from the common power supply line 172 and the data voltage provided by the switching thin film transistor 10 is stored in the capacitor 80, and a current corresponding to the voltage stored in the capacitor 80 flows to the organic light emitting diode 300 through the driving thin film transistor 20 to cause light to emit from the organic light emitting diode 300.

The encapsulator 400 is provided on the organic light emitting diode 300.

The encapsulator 400 seals the organic light emitting diode 300 together with the flexible substrate 100 and includes an organic layer 410 and an inorganic layer 420.

The organic layer 410 is formed of a polymer and it may be a single layer or a deposition layer including one of polyethylene terephthalate, a polyimide, a polycarbonate, an epoxy, polyethylene, and a polyacrylate. In embodiments in which the organic layer 410 is formed with a polyacrylate, it may include a polymerized monomer composition including a di-acrylate monomer and a tri-acrylate monomer.

The inorganic layer 420 is provided on the organic layer 410 and can be a single layer or a stacked layer including a metal oxide or a metal nitride. For example, the inorganic layer 420 includes at least one of a silicon nitride ($SiN_x$), alumina ($Al_2O_3$), a silicon oxide ($SiO_x$), and titanium oxide ($TiO_2$).

In some embodiments, there are a plurality of organic layers 410 and inorganic layers 420, and the inorganic layer 420 can be provided at the highest layer of the encapsulator 400 configured with a plurality of organic layers 410 and a plurality of inorganic layers 420. Also, the organic layers 410 and the inorganic layers 420 can be alternately stacked.

According to one embodiment of the present invention, the protection film 500 is attached to a bottom surface of the flexible substrate 100. The protection film 500 can be formed with polymers for reinforcing strength of the flexible substrate 100 and for protecting the flexible substrate 100 from external interference.

The flexible display device 1001 according to the first exemplary embodiment can be manufactured by using a method for manufacturing a flexible display device according to a second exemplary embodiment to be described.

Referring to FIGS. 4, 5, 6, 7, 8, 9, 10, and 11, a method for manufacturing a flexible display device according to a second exemplary embodiment will now be described.

Figure 4:
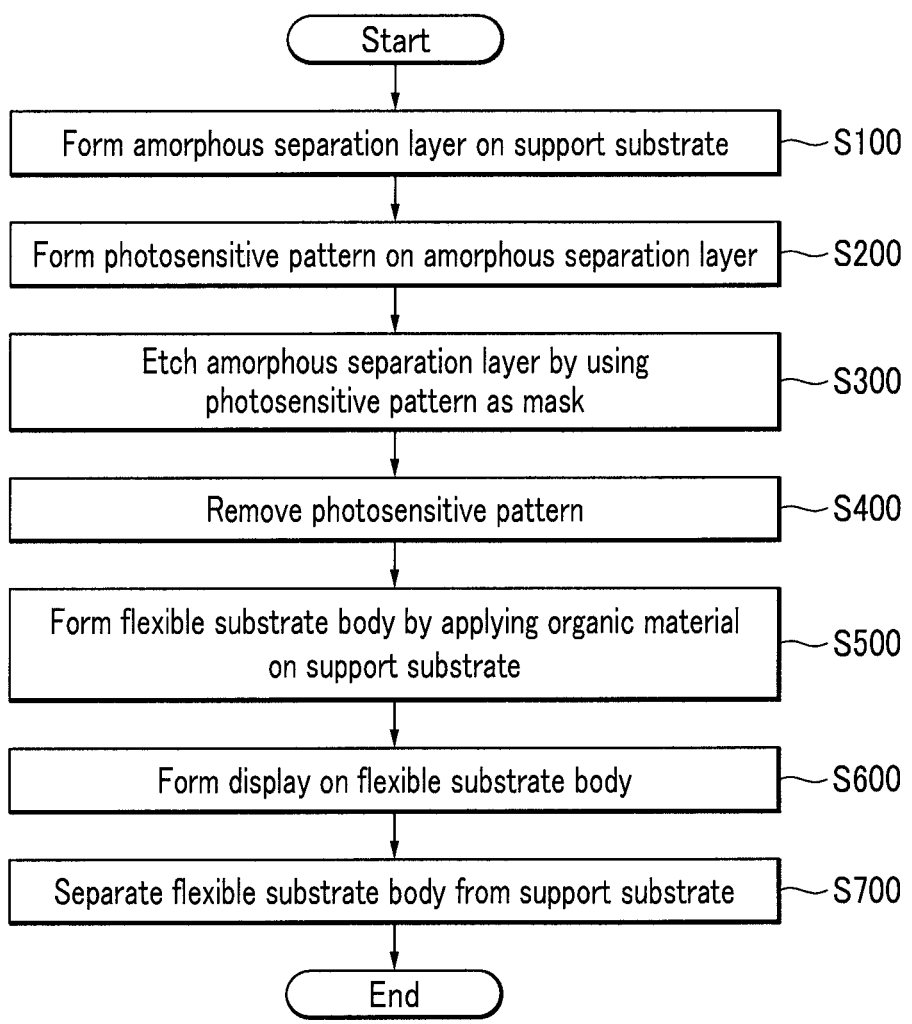
FIG. 4 shows a flowchart of a method for manufacturing a flexible display device according to a second exemplary embodiment.

FIG. 4 shows a flowchart of a method for manufacturing a flexible display device according to a second exemplary embodiment. FIGS. 5, 6, 7, 8, 9, 10, and 11 show a method for manufacturing a flexible display device according to a second exemplary embodiment.

An amorphous separation layer may be a separation layer, an amorphous support pattern may be a support pattern, and a crystallization separating pattern may be the separation pattern.

Figure 5:
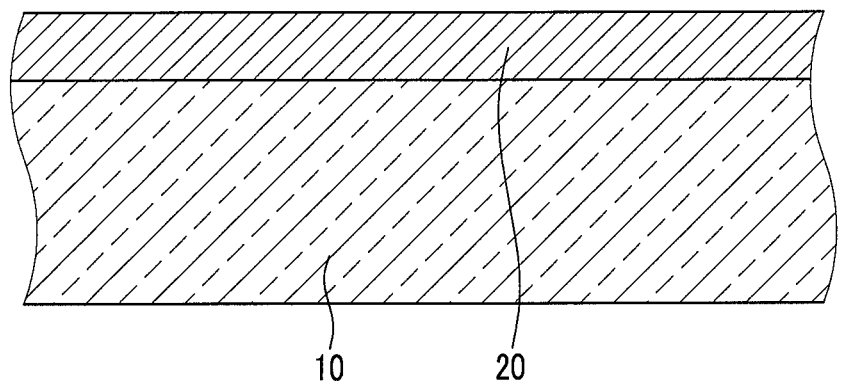
FIGS. 5, 6, 7, 8, 9, 10, and 11 show a method for manufacturing a flexible display device according to a second exemplary embodiment.

As shown in FIG. 4 and FIG. 5, an amorphous separation layer 20 is formed on the support substrate 10 (see, e.g., S100 of FIG. 4).

In more detail, the amorphous separation layer 20 is formed on the support substrate 10 made of glass, metal, or an inorganic material (e.g., a ceramic). The amorphous separation layer 20 is formed by depositing amorphous indium tin oxide (a-ITO) on the support substrate 10. In this instance, when the amorphous separation layer 20 is formed to be 300

Å to 1100 Å thick, poly indium tin oxide is formed at a top of the amorphous separation layer 20 from the amorphous indium tin oxide. After the amorphous separation layer 20 is formed, heat is applied to the amorphous separation layer 20 to form the poly indium tin oxide at the top of the amorphous separation layer 20.

Figure 6:
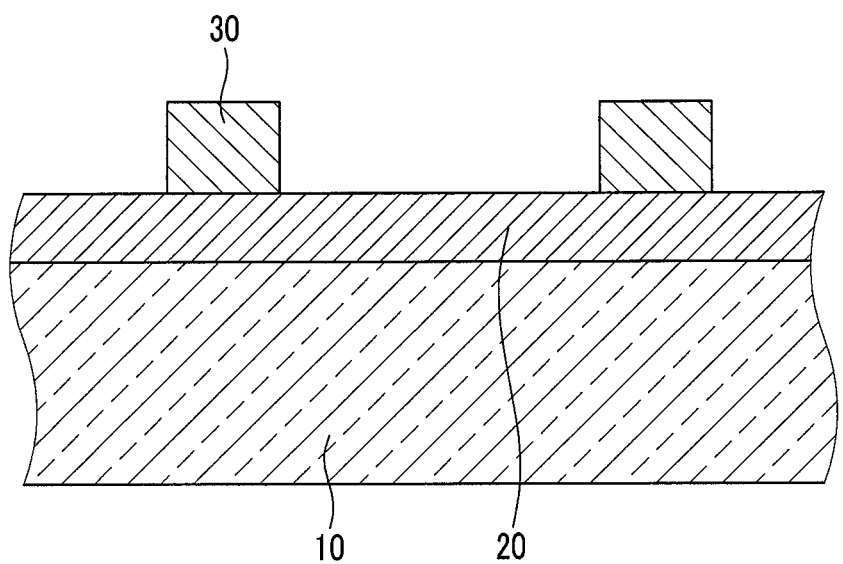

As shown in FIG. 6, a photosensitive pattern 30 is formed on the amorphous separation layer 20 (see, e.g., S200 of FIG. 4).

In more detail, a photosensitive layer is formed on the amorphous separation layer 20, the photosensitive layer is exposed by using a mask including a light transmitting portion corresponding to the photosensitive pattern 30, and the exposed photosensitive layer is developed to form the photosensitive pattern 30 on the amorphous separation layer 20. A plurality of photosensitive patterns 30 is disposed along the top surface of the amorphous separation layer 20.

Figure 7:
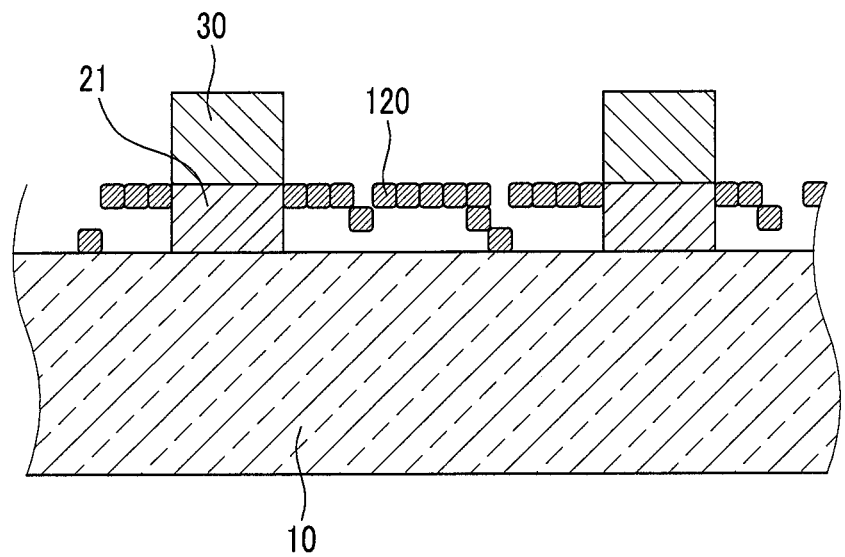

As shown in FIG. 7, the amorphous separation layer 20 is etched by using the photosensitive pattern 30 as a mask (see, e.g., S300 of FIG. 4).

In more detail, the amorphous separation layer 20 is etched by using the photosensitive pattern 30 as a mask to form an amorphous support pattern 21 corresponding to the photosensitive pattern 30, and crystallization separating patterns 120, at least one of which neighbors (or is adjacent to) the amorphous support pattern 21, is provided in a distributed manner on (e.g., is distributed over) the support substrate 10.

The amorphous separation layer 20 is etched by using a dry etching method using an etchant for removing the amorphous indium tin oxide, and because the poly indium tin oxide is formed at the top of the amorphous separation layer 20, a part that corresponds to the photosensitive pattern 30 from among the entire part of the amorphous separation layer 20 is formed as the amorphous support pattern 21 from the amorphous separation layer 20, and a remaining part is formed as the crystallization separating pattern 120 configured with (e.g., from) the poly indium tin oxide from the amorphous separation layer 20. The poly indium tin oxide is mainly formed at the top of the amorphous separation layer 20 so the crystallization separating pattern 120 is generally separated (or spaced) from the support substrate 10. The crystallization separating pattern 120 flows from the support substrate 10.

Figure 8:
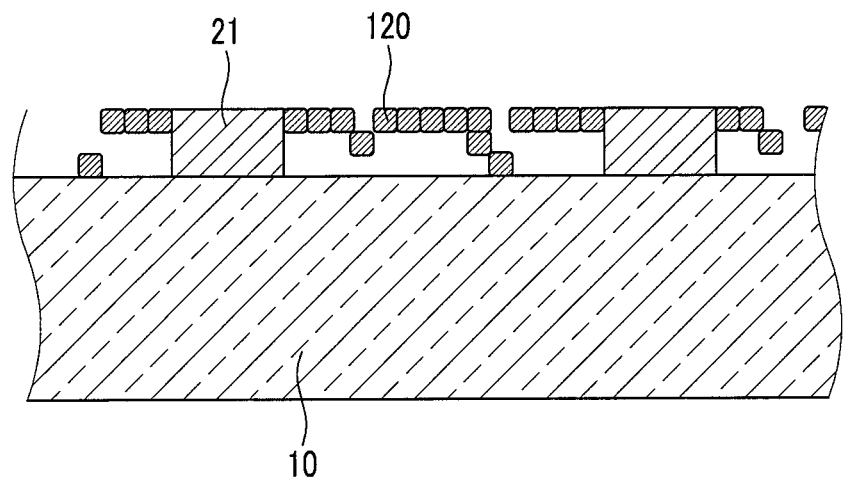

As shown in FIG. 8, the photosensitive pattern 30 is removed (see, e.g., S400 of FIG. 4).

In more detail, the photosensitive pattern 30 may be removed from the amorphous support pattern 21 by using an ashing process or a lift-off process. By removing the photosensitive pattern 30, the amorphous support pattern 21 and the photosensitive pattern 30 are exposed.

Figure 9:
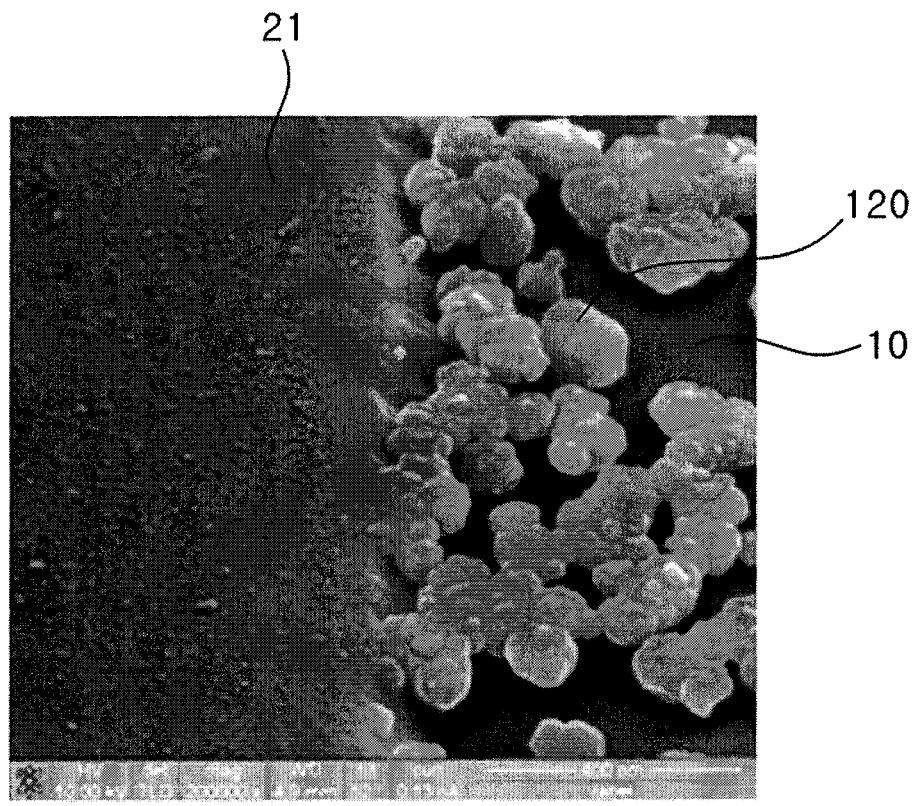

FIG. 9 shows an amorphous support pattern and a crystallization separating pattern that are formed during the method for manufacturing a flexible display device.

As shown in FIG. 9, the exposed amorphous support pattern 21 and the crystallization separating pattern 120 neighboring (or adjacent) the amorphous support pattern 21 are formed on the support substrate 10.

Figure 10:
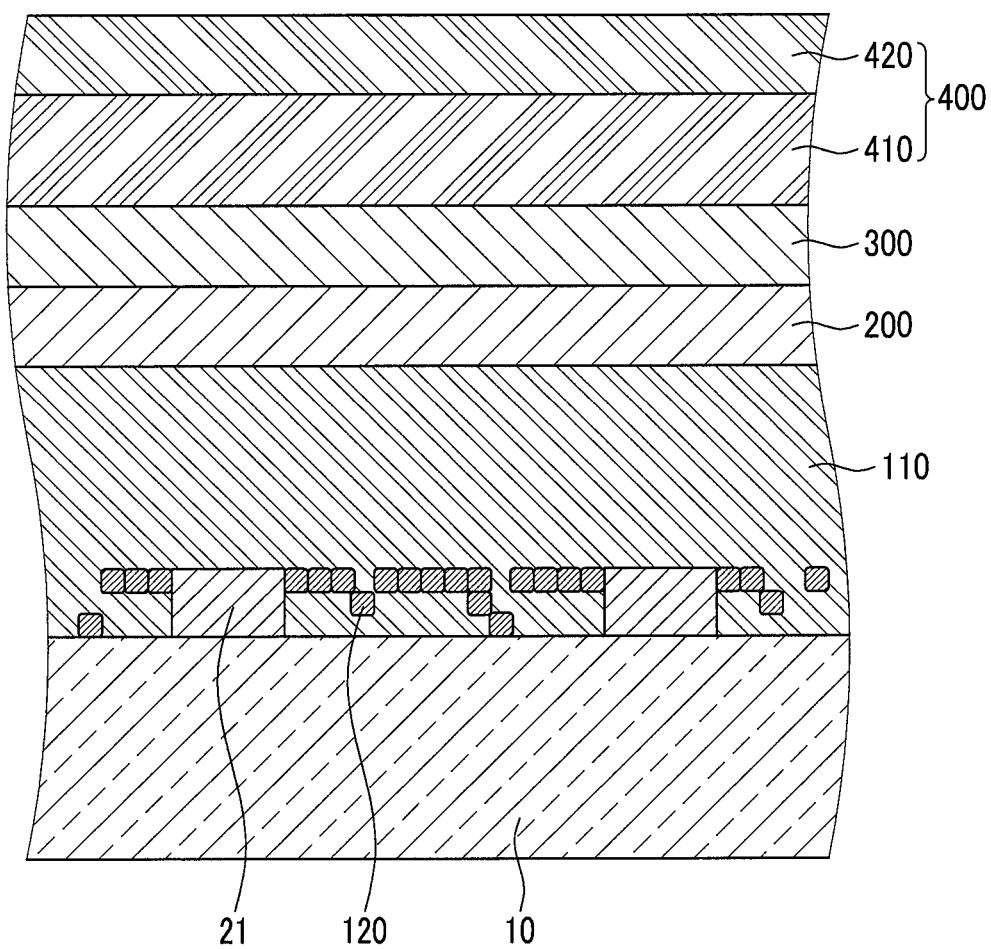

As shown in FIG. 10, an organic material is applied to the support substrate 10 to form the flexible substrate main body 110 (see, e.g., S500 of FIG. 4).

In more detail, the flexible substrate main body 110 is formed on the support substrate 10 by applying the organic material to the support substrate 10 so as to cover the amorphous support pattern 21 and the crystallization separating pattern 120. Accordingly, the crystallization separating pattern 120 is provided inside (e.g., embedded in) the bottom of the flexible substrate main body 110. For example, the flexible substrate main body 110 is formed on the support substrate 10 by applying a polyimide to the support substrate 10.

The organic light emitting diode 300 is formed as a display on the flexible substrate main body 110 (see, e.g., S600 of FIG. 4).

In more detail, the wiring 200 and the organic light emitting diode 300 are formed on the flexible substrate main body 110 by using a photolithography process and a deposition process to form the display on the flexible substrate main body 110.

Also, the encapsulator 400 is formed by forming the organic layer 410 and the inorganic layer 420 on the organic light emitting diode 300.

Figure 11:
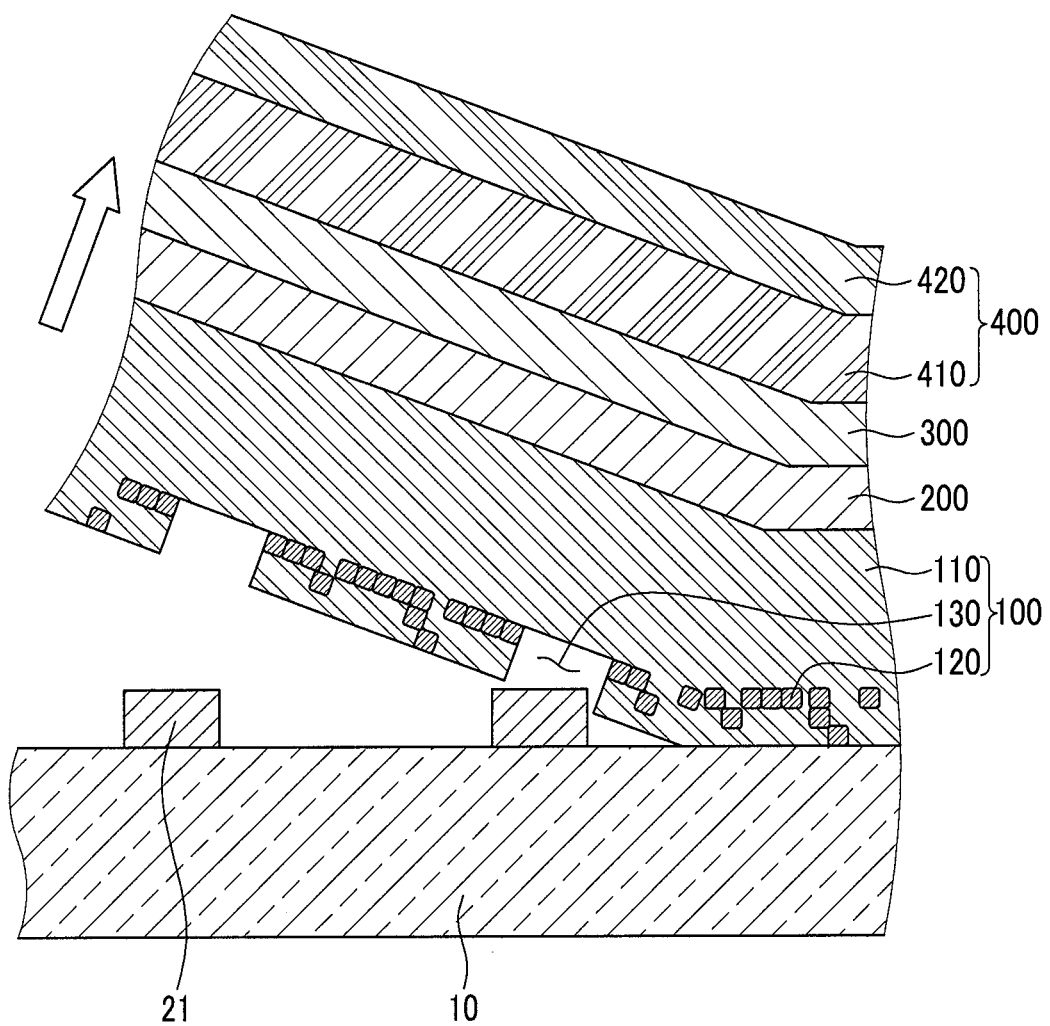

As shown in FIG. 11, the flexible substrate main body 110 is separated from the support substrate 10 (see, e.g., S700 of FIG. 4).

In more detail, the flexible substrate main body 110 is peeled from the support substrate 10 to separate the flexible substrate main body 110 from the support substrate 10. By separating the flexible substrate main body 110 from the support substrate 10, the crystallization separating pattern 120 provided in the flexible substrate main body 110 is separated from the support substrate 10 and the flexible substrate main body 110 is separated from the amorphous support pattern 21 to form a separation groove 130 recessed from the bottom surface of the flexible substrate main body 110 corresponding to the amorphous support pattern 21 at the bottom of the flexible substrate main body 110. In this instance, the crystallization separating pattern 120 is provided at the bottom of the flexible substrate main body 110 that may be one side of the flexible substrate main body 110, and the crystallization separating pattern 120 prevents or reduces the generation of static electricity when the flexible substrate main body 110 is peeled from the support substrate 10. By separating the flexible substrate main body 110 from the support substrate 10, the flexible substrate 100 including the flexible substrate main body 110, the crystallization separating pattern 120, and the separation groove 130 is formed.

A protection film is attached to the bottom surface of the flexible substrate main body 110 to manufacture or construct the flexible display device 1001 according to the first exemplary embodiment.

Therefore, the method for manufacturing a flexible display device according to the second exemplary embodiment for manufacturing the flexible display device 1001 according to the first exemplary embodiment forms the crystallization separating pattern 120 including the poly indium tin oxide on the support substrate 10, and provides the crystallization separating pattern 120 inside the bottom of the flexible substrate main body 110 to thereby control generation of static electricity when the flexible substrate main body 110 is peeled from the support substrate 10. Hence, damage to the organic light emitting diode 300 (which is used as a display) by static electricity is controlled to improve reliability and efficiency in manufacturing the flexible display device 1001.

Further, the method for manufacturing a flexible display device according to the second exemplary embodiment for manufacturing the flexible display device 1001 according to the first exemplary embodiment forms the amorphous support pattern 21 mainly including the amorphous indium tin oxide on the support substrate 10 to separate the flexible substrate main body 110 from the amorphous support pattern 21, and thus easily separates the flexible substrate main body 110 from the support substrate 10.

Accordingly, efficiency in manufacturing the flexible display device 1001 is improved.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and equivalents thereof.

What is claimed is:

1. A flexible substrate comprising:
   a flexible substrate main body comprising an organic material;
   a plurality of separation patterns distributed across one side of the flexible substrate main body; and
   a separation groove on the one side of the flexible substrate main body adjacent to at least one of the separation patterns, the separation groove being recessed from a surface of the one side of the flexible substrate main body, the separation patterns being clustered together in portions of the flexible substrate main body neighboring the separation groove.

2. The flexible substrate of claim 1, wherein the separation pattern comprises a poly indium tin oxide (poly-ITO).

3. The flexible substrate of claim 1, wherein the separation pattern is embedded in the flexible substrate main body.

4. The flexible substrate of claim 1, wherein the organic material comprises a polyimide.

5. A flexible display device comprising:
   a flexible substrate according to claim 1; and
   a display provided on the flexible substrate and configured to display an image.

6. The flexible display device of claim 5, wherein the display comprises an organic light emitting diode.

* * * * *